United States Patent [19]

Nigg et al.

[11] Patent Number: 4,659,157
[45] Date of Patent: Apr. 21, 1987

[54] STAMPED CIRCUITRY ASSEMBLY

[75] Inventors: Daniel Nigg, Rolling Meadows; Robert DeRoss, Naperville; Edward Sommer, Addison; Jack D. Raymer, II, Lisle; Burke Crane, Bloomingdale, all of Ill.

[73] Assignee: Molex Incorporated, Lisle, Ill.

[21] Appl. No.: 771,858

[22] Filed: Sep. 3, 1985

[51] Int. Cl.$^4$ .................................. H01R 29/00
[52] U.S. Cl. ........................ 339/18 R; 339/17 CF
[58] Field of Search ............ 200/292, 67 DA, 67 E; 339/18 R, 18 P, 176 MP, 17 CF, 17 F

[56] References Cited

U.S. PATENT DOCUMENTS

| | | | |
|---|---|---|---|
| 2,969,300 | 1/1961 | Franz | 154/96 |
| 2,971,249 | 2/1961 | Anderson et al. | 29/155.5 |
| 3,108,360 | 10/1963 | Hackler | 29/155.5 |
| 3,362,181 | 1/1968 | Linstromberg | 62/135 |
| 3,399,452 | 9/1968 | Reid | 29/629 |
| 3,845,256 | 10/1974 | Edwards | 339/17 C |
| 4,164,071 | 8/1979 | Kruzich | 339/17 LC |
| 4,255,005 | 3/1981 | Fukunga | 339/17 C |
| 4,384,755 | 5/1983 | Perretta | 339/18 R |
| 4,508,399 | 4/1985 | Dowling et al. | 339/17 CF |

OTHER PUBLICATIONS

Electronic Design; "PC Peg Boards Speed Breadboard Layout", pp. 94–95; Oct. 28, 1959.

Primary Examiner—Gil Weidenfeld
Assistant Examiner—Paula A. Austin
Attorney, Agent, or Firm—Louis A. Hecht

[57] ABSTRACT

Disclosed is a printed circuit board assembly including an integral metal stamping having a plurality of conductive circuit paths received in complementarily-shaped recesses of a dielectric substrate. The integral metallic stamping includes an improved snap action switch having an improved actuator mechanism, an improved rotary switch of the type making on/off contact during rotation thereof, and an upstanding plug-like connector member receivable in a mating female connector. Each of the switches mentioned above as well as the plug-like connector can be formed separately in different printed circuit board assemblies.

1 Claim, 11 Drawing Figures

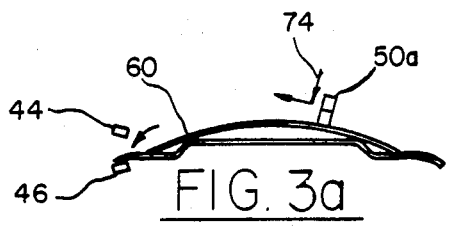
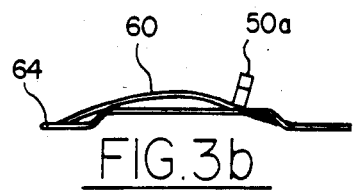
FIG. 3a  FIG. 3b
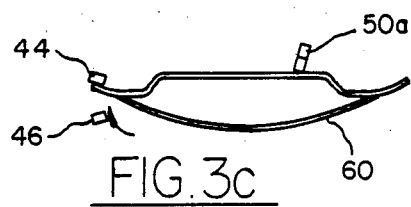
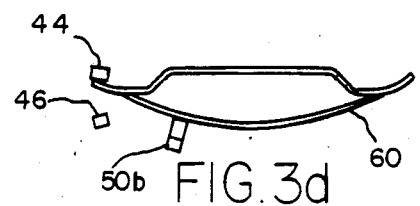
FIG. 3c  FIG. 3d
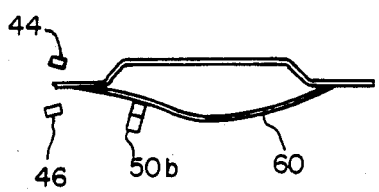
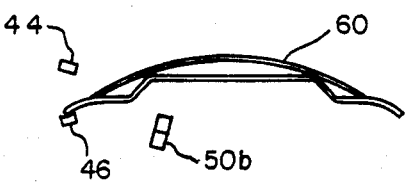
FIG. 3e  FIG. 3f
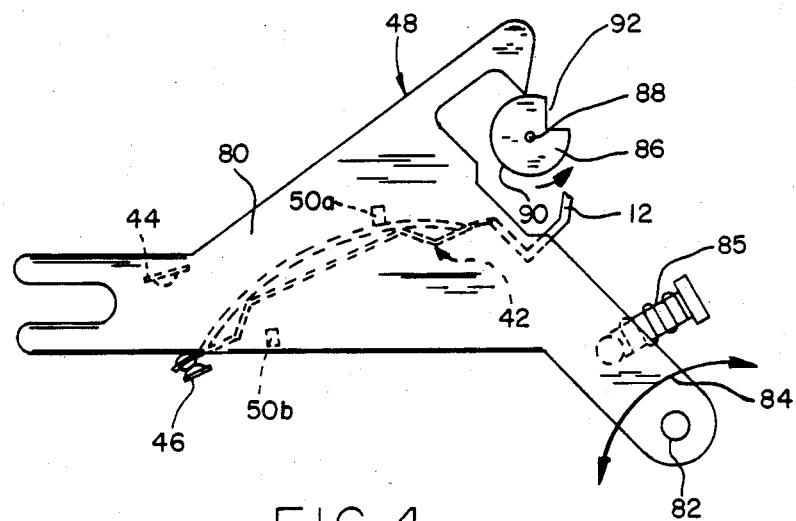
FIG. 4

STAMPED CIRCUITRY ASSEMBLY

BACKGROUND OF THE INVENTION

1. Field of the Invention

The present invention pertains to stamped circuitry assemblies of the type wherein conductive traces are stamped from a metal sheet, and thereafter applied by adhesive or the like to a dielectric substrate.

2. Brief Description Of The Prior Art

Printed circuit board assemblies produced by photographic and the like techniques are commonly employed to provide a convenient fabrication of high density electrical circuits. However, it is frequently desireable to incorporate mechanical systems in the high density cicuits. Conventional printed circuit board assemblies are not satisfactory for this application, since they have a comparatively low limit to the maximum current permissible, at least in economical forms of construction. Also, a direct connection between circuit elements lying in different planes is generally impossible, so that in such cases, additional conductors have to be introduced between circuit traces and the individual elements which do not lie in a common plane. Further, conventional printed circuit board assemblies do not provide the mechanical ruggedness necessary in hybrid electro-mechanical circuit boards, particularly when the circuit is exposed to continuous vibration in operation, especially when the circuit traces must also carry high current levels which tend to degrade the mechanical strength properties of those traces. One example of a hybrid electromechanical device is shown in U.S. Pat. No. 3,845,256 which describes an appliance timer having an electric motor, a series of gears and rotating members, affixed to the surface of a single plane dielectric substrate.

Accordingly, stamped metallic circuits have been developed to provide the high current capability, mechanical ruggedness, and multiplane construction needed for a given application. Examples of representative stamped metallic circuits can be found in U.S Pat. Nos. 3,108,360; 2,971,249 and 2,969,300. Typically, the conductive traces are separately formed, being stamped from a metallic sheet, to form labyrinthian circuit paths. The paths may be joined by one or more separable linking elements to form a carrier, or to strengthen the lattice network for use during assembly of the metallic circuit. Thereafter, the metallic stamping is applied to a dielectric substrate, typically using adhesive suitable for the purpose. In U.S. Pat. No. 3,108,360, for example, the stamped metal tracing is sandwiched between two dielectric sheets to protect a majority of the conductive circuit paths from corrosion or the like degradation. A similar arrangement is found in the more recent U.S. Pat. No. 4,508,399. Again the stamped metallic surface is sandwiched between two dielectric portions which substantially enclose the circuit, protecting it from casual damage.

Although each of the above arrangements provide otherwise convenient means of electrical connection to external circuit components, improvements in the electrical connectors can be made. Also, it is desired to incorporate in an inexpensive fashion, adjustable electrical connectors of the type frequently employed in timing and other measuring circuits. Further, especially when employed in highly inductive loads, it is desirable to provide a snap action switch which provides improved circuit making stroke breaking capability. In the past, such switches have comprised discrete commercially available separate assemblies, such as those shown in U.S. Pat. No. 3,362,181. Instead of employing a discrete miniature snap action switch, it would be desirable to integrally form a snap action switch with the stamped metallic circuit, in a single operation.

SUMMARY OF THE INVENTION

Accordingly, it is an object of the present invention to provide a stamped metallic circuit which is compatible with mechanical systems, and which is simply and inexpensively formed from a single stamped conductive sheet, supported by a unitary dielectric substrate.

Another object of the present invention is to provide a stamped metallic circuit having an improved snap action switch element integrally formed with a stamped metallic circuit.

Still another object of the present invention is to provide an improved actuation system for use with the snap action switch referred to above.

Yet another object of the present invention is to provide an improved electrical plug connector integrally formed with the stamped metallic circuit and dielectric substrate, which offers improved strength and reliability of operation.

Still another object of the present invention is to provide an improved adjustable switch which can be simply and easily formed from the integral stamped metallic circuit, and which requires a minimum number of additional components.

These and other objects of the present invention are provided by a stamped circuitry assembly including an integral metal stamping having a plurality of discrete conductive paths, a dielectric substrate having complementary recesses for receiving said conductive paths, the improvement comprising:

said substrate including an upstanding support wall and a movably mounted table with a surface defining at least one path of movement;

said stamping including a plurality of upstanding finger-like male contacts overlying and coextensive with said support wall so as to form a plug connector slidingly receivable in a plugreceiving cavity of a mating female receptacle connector having a plurality of mating second contacts;

said stamping further including a snap action switch having an elongated resilient spring plate with two parallel elongated spaced-apart slots therein forming two outside support arms each including a pair of spaced offset portions all extending in the same direction transverset to said spring plate and an intermediate flexing arm, a first mounting end and an opposed second free end, contact carrying means at said second free end, the switch further including actuator means deflecting a medial portion of the plate to displace the contact carrying means between first and second bistable positions, said actuator means comprising a rigid member having first and second engaging surfaces disposed on either side of said flexing arm, mounted for pivoting in a first direction to slide said first engaging surface along said flexing arm while deflecting said flexing arm from a first to a second bistable position;

a contact pad carried on the table and having a tapered leading edge, disposed along a portion of said path; and said stamping further including an elongated resilient finger-like contact means having a contact surface disposed on said path so as to electrically engage said contact pad as said table is moved, a movable support arm extending in a direction transverse to said path, joined at a first end to said finger-like contact means and threadingly joined at a second end to screw adjustment means operative to reciprocate said support arm in said transverse direction, whereby reciprocation of said support arm causes transverse displacement of said finger-like contact means, with said finger-like contact means engaging said contact pad at different points along its tapered leading edge, to thereby vary the length of the path along said contact pad travelled by said finger-like contact means. The snap action switch including an elongated resilient spring plate with two parallel elongated spaced-apart slots therein forming two outside support arms and an intermediate flexing arm, a first mounting end and an opposed second free end, contact carrying means spaced from said mounting end, the switch further including actuator means deflecting a medial portion of the plate to displace the contact carrying means between first and second bistable positions. The improvement resides in the contact carrying means disposed at said second free end; said support arms each including a pair of spaced offset portions, all of which extend in the same direction transverse to said spring plate; and said actuator means displacing said flexing arm in first and second directions generally transverse to the spring plate, to cause differential bowing between said flexing arm and said support arms, whereby said contact carrying means is displaced in said first and said second directions.

In addition, according to the present invention, an improved actuator means for the above snap action switch comprises a rigid member having first and second engaging surfaces disposed on either side of said flexing arm, mounted for pivoting in a first direction to slide said first engaging surface along said flexing arm while deflecting said flexing arm from a first to a second bistable position, and said rigid member mounted for pivoting in a second opposed direction to impulsively deflect said flexing arm with said second engaging surface, from said second to said first bistable position.

Also, the present invention provides a switch including a movably mounted table having a surface defining at least one path of movement, a contact pad disposed along a portion of said path, and elongated resilient finger-like contact means having a contact surface disposed on said path so as to electrically engage said contact pad as said table is moved. The improvement comprises a moveable support arm extending in a direction transverse to said path, joined at a first end to said finger-like contact and threadingly joined at a second end to screw adjustment means operative to reciprocate said arm in said transverse direction; and said contact having a tapered leading edge, whereby reciprocation of said arm causes transverse displacement of said finger-like contact, with said finger-like contact engaging said contact pad at different points along its tapered leading edge, to thereby vary the length of the path along said contact travelled by said finger-like means.

Further, the present invention provides a stamped circuitry assembly including an integral metal stamping having a plurality of discrete conductive paths, a dielectric substrate having complementary recesses for receiving said conductive paths. The improvement comprises substrate including an upstanding support wall; said stamping including a plurality of upstanding finger-like male contacts overlying and coextensive with said support wall so as to form a plug connector slidingly receivable in a plug-receiving cavity of a mating female receptacle connector having a plurality of mating second contacts.

In addition, according to the present invention, stamped metallic circuits are provided incorporating one or more of each of the above features.

BRIEF DESCRIPTION OF THE DRAWINGS

In the drawings, wherein like elements are referenced alike,

FIGS. 3a-3f show a sequence of operations wherein the actuator of FIG. 1 deflects the spring member of FIGS. 2a, 2b between two bistable positions;

FIG. 4 is a plan view of an actuator of FIG. 1; and

DETAILED DESCRIPTION OF THE PREFERRED EMBODIMENT

Figure 1:
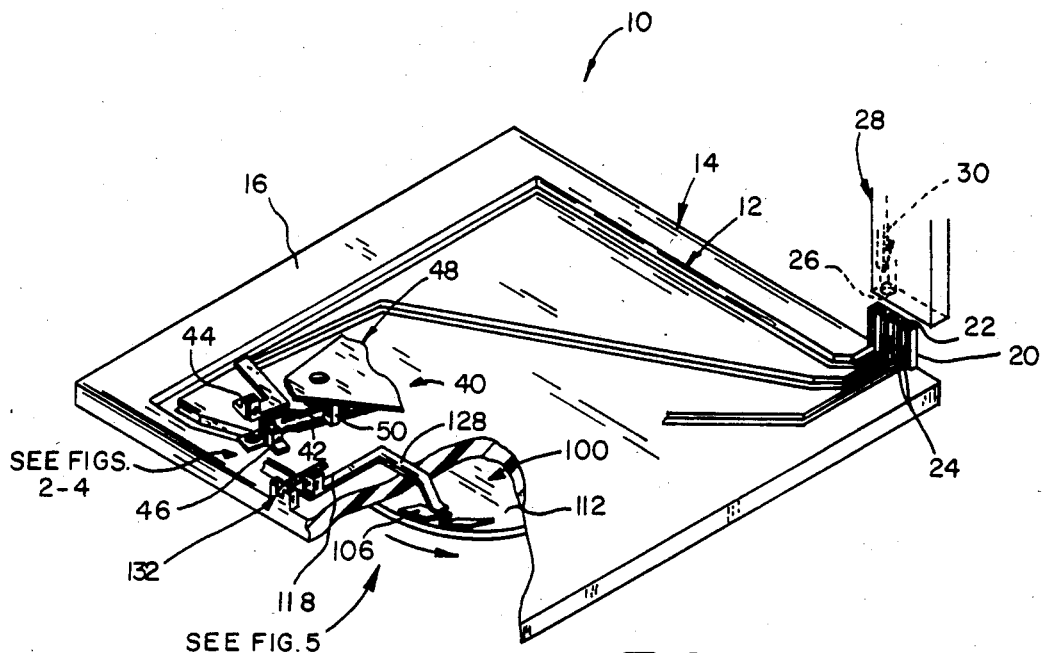
FIG. 1 is a perspectie view of a stamped circuitry assembly according to the present invention.

Referring now to the drawings, and initially to FIG. 1, a stamped circuitry assembly is indicated generally at 10. Assembly 10 includes an integral stamped circuit 12, formed from a unitary metal sheet to have a plurality of discrete conductive paths, as well as the plug and switch components decribed later herein. Stamped metallic surface 12 is supported by a dielectric substrate 14. Although stamped circuit 12 can be affixed to dielectric substrate 14 using adhesives of any suitable type, substrate 14 is preferably formed to have recesses of varying depths to receive the conductive paths of circuit 12 with a friction fit. As is known in the art, stamped circuit 12 can include one or more separable carrier or linking members disposed at strategic places between adjacent conductive paths to lend mechanical support during fabrication of assembly 10. Since stamped circuit 12 is of a one-piece unitary construction including several spring members, it is preferably stamped from a single sheet of spring material such as phosphor bronze of thickness ranging between 0.005 and 0.015 inches.

The surface 16 of substrate 14 is generally of a flat planar shape having openings formed therein by the various circuit-receiving recesses. As can be seen in the right hand corner of substrate 14, an upstanding support wall 20 projects above surface 16. Support wall 20 includes a plurality of recesses 22 to receive a complementary plurality of upstanding finger-like male contacts 24 overlying and coextensive with wall 20. Contacts 24 and support wall 20 together comprise a plug-like connector slideably receivable in the plug receiving cavity 26 of a mating female receptacle 28. A corresponding plurality of mating contacts are disposed in cavity 26 for mating with male contacts 24. The plug assembly of wall 20 and contacts 24 could, if desired, be located in interior portions of substrate 14 to provide a convenient point of electrical connection to an external circuit.

Figure 2A:
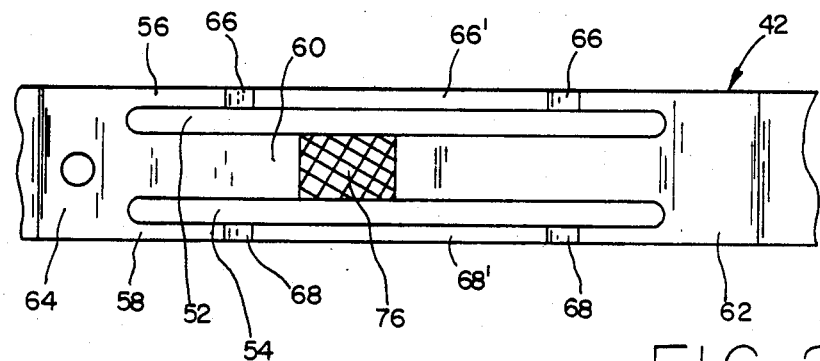
FIGS. 2a and 2b are elevation and plan views, respectively, of the spring switch member of FIG. 1.
Figure 2B:
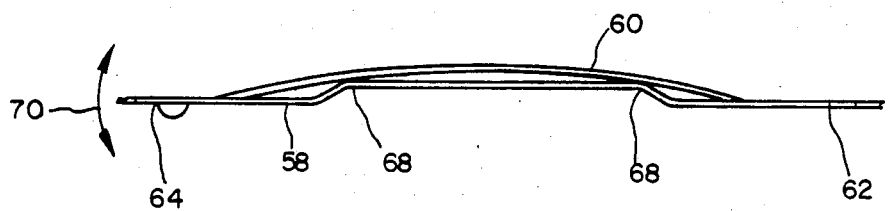

A snap action switch assembly shown in the left-hand corner of FIG. 1 is indicated generally at 40. Assembly 40 includes a spring plate 42 moveable between a pair of fixed contacts 44, 46. A plunger assembly indicated generally at 48 includes projection 50 which deflects spring plate 42 between two bistable positions. Spring plate 42 is shown in greater detail in FIGS. 2a and 2b. Spring plate 42 is formed of resilient conductive material as part of the integral stamping of circuit 12. Spring plate 42 has formed therein two parallel elongated spaced-apart slots 52, 54 which form two outside support arms 56, 58 and an intermediate flexing arm 60. Spring plate 42 has a first mounting end 62 and an opposed second free end 64 which establishes electrical contact between elements 44, 46. Outside support arm 56 includes a pair of spaced apart offset portions 66, and similarly outside support arm 58 includes a pair of offset portions 68. Portions 66, 68 are offset from the common plane of mounting end 62 and free end 64. Although, as shown in FIG. 2b, outside intermediate portions 66' 68' joining offset portion 66, 68 respectively, are also offset, they can be arranged to lie in the plane of ends 62, 64.

In operation, the free end 64 of spring plate 42 moves in the direction of arrow 70 between two bistable positions, as indicated in the sequence shown in FIGS. 3a-3f. As shown in FIG. 3a, free end 64 is in a first bistable position so as to establish electrical connection with contact 46.

Referring to FIG. 4, a plunger assembly generally indicated at 48 includes a pair of projections 50a, 50b which contact the flexing arm 60 so as to displace the free end 64 in first and second directions generally transverse the spring plate 42. As indicated in FIG. 3a, projection 50a is advanced along flexing arm 60 in the two directions indicated by double headed arrow 74. That is, projection 50a is advanced in a direction generally transverse to flexing arm 60, while also being advanced to slide along the length of the camming area 76 of flexing arm 60. Thus, projection 50a deflects flexing arm 60 with a camming action as indicated by the cross-hatched area 76 of FIG. 3b. At a critical point of deflection, flexing arm 60 takes on the second bistable position indicated in FIG. 3c owing to the differential bowing between flexing arm 60 and outside support arms 56, 58. Thereafter, projection 50b is advanced toward flexing arm 60 so as to cause an opposite deflection toward the first bistable position of FIG. 3a, whereupon contact is again established with member 46 as indicated in FIGS. 3a, 3f. In the preferred embodiment, the second projection 50b is advanced toward flexing arm 60 with an impulsive movement, whereas the first projection 50a is moved in a slower fashion with continuous pressure being applied during camming with flexing arm 60. The camming operation was found to provide a better control of flexing arm deflection, although this was not required on the return stroke of projection 50b. In either event, the immediate application in the preferred embodiment is merely insensitive to contact bounce and jitter, although other applications may be more critical in this regard.

Referring now to FIG. 4, plunger assemby 48 comprises an actuator arm 80 pivotally mounted at 82 to dielectric substrate 14 for movement in a direction of arrow 84. Arm 80 is biased in one direction by a compression 85 indicated in diagrammatic form. Actuation of arm 80 is conveniently provided by a cam 86 pivotally mounted at 88 for movement in a counterclockwise direction. Cam 86 has a first continuous outer surface portion 90 for continuous camming engagement with arm 80 so as to pivot the arm in a first counterclockwise direction. Cam 86 also includes a recess portion 92 which withdraw as the camming engagement, allowing movement of arm 80 in a counterclockwise direction under the force of spring 85. Thus, the camming sliding engagement with projection 50a and flex arm 60 is provided, along with an impulsive deflection of flexing arm 60 is projection 50b.

As indicated in FIGS. 1 and 4, actuator arm 80 comprises a plate-like member lying in a plane parallel to the deflection movement of spring plate 42, and overlies the spring plate to provide a covering protection therefore. The actuator arms 50 as can be seen in FIG. 1, depends from the plate-like member 80 having a convenient dog-leg shape.

Figure 5:
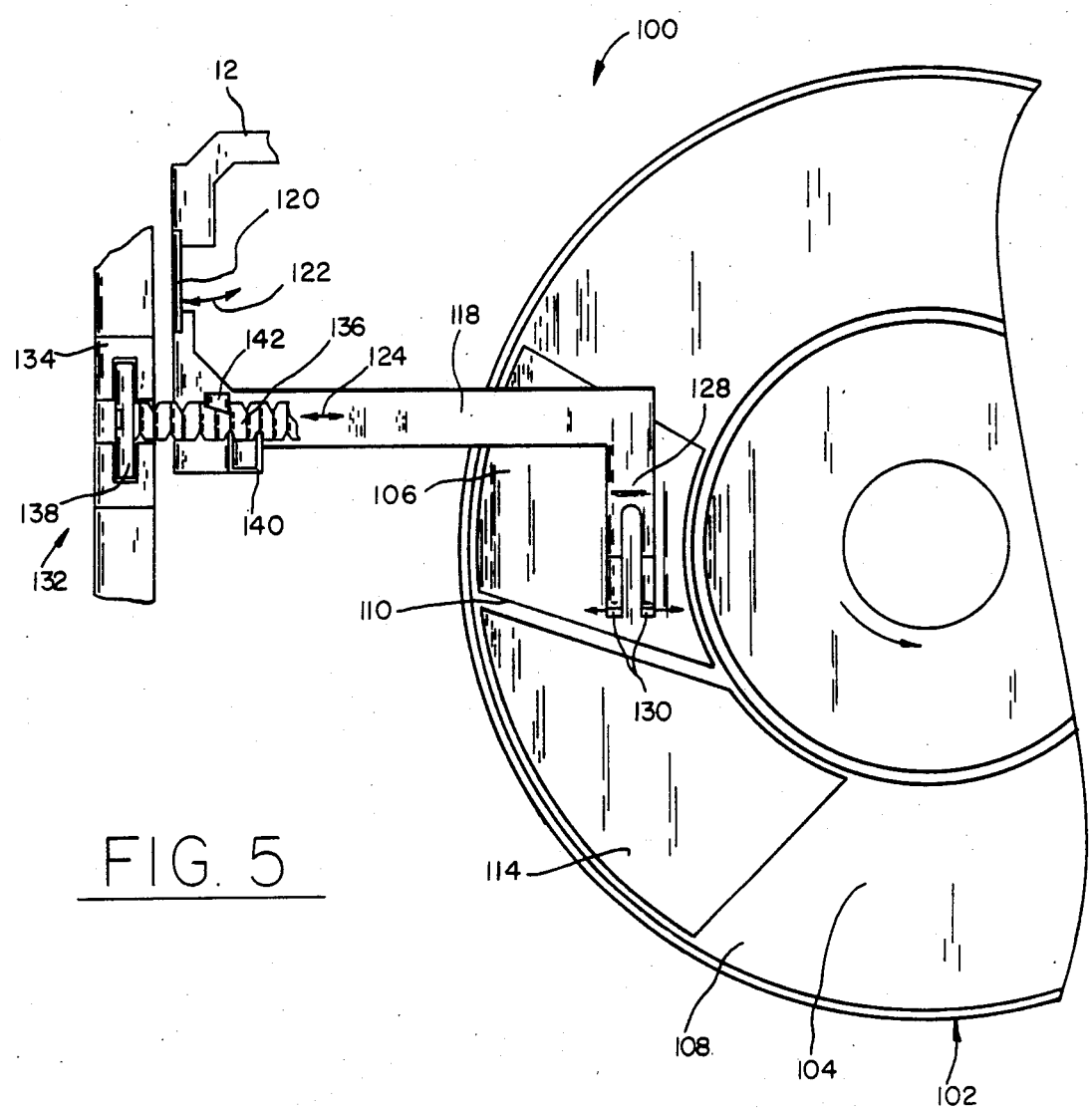
FIG. 5 is a plan view showing the rotary switch of FIG. 1.

Referring now to FIG. 5, a rotary switch assembly is indicated generally at 100 to include a rotatably mounted table 102 defining a circular path of movement 104. A plate-like contact member 106 is disposed on an upper surface 108 of table 102. Table 102 is mounted for counterclockwise rotation due to a conventional pivoting means affixed to substrate 14. Contact 106 has a tapered leading edge 110, which is tapered in a radial sense to provide an advantageous timing relationship as will be explained herein. Table 102 is mounted to the underside of dielectric substrate 14, and the window-like aperture 112 provides communication with path 104 from components lying on upper substrate surface 16. In the preferred embodiment, contact 106 has an upper wiping surface projecting above upper table surface 108. Accordingly, to provide a smooth transition a ramp-like member 114 is provided from the same metal plate from which contact 106 is stamped. Although ramp 114 can be electrically connected, it is electrically isolated in the preferred embodiment.

An elongated moveable support arm 118 is connected to stamped circuit 12 through a cantilever spring beam 120. As spring beam 120 flexes in the direction of arrow 122, support arm 118 is moved in directions transverse to path 104, as indicated by arrow 124. Support arm 118 is joined at a first end to a finger-like contact 128 having bifurcated contact surfaces 130 which slide along the upper surface of ramp 114 and electrical contact 106 in wiping electrical engagement therewith. Support arm 118 is joined at a second end to a screw adjustment assembly 132 consisting of a yoke 134 integrally formed with a substrate 14 and a conventional screw member 136 having a head 138. Yoke 134 provides a conventional rotatable mounting for screw head 138, allowing rotation of screw 136 without an axial advancement thereof. Support arm 118 has saddle-like threading engagement means 140 comprising a U-shaped plate which engages two adjacent threads of screw 136. A tab 142 opposing saddle 140 maintains threading engagement between support arm 118 and screw 136, during screw rotation. As screw 136 is rotatably adjusted, support arm 118 is deflected in the direction of arrow 124, to move the bifurcated contact surfaces 130 in a direction transverse to path 104 so that, on subsequent rotation of table 102, contact surfaces 130 engage different points along the tapered leading edge 110 of contact 106. This adjustment in effect varies the length of the path along the contact 106 travelled by finger-like contact 128, thereby controlling the timing duration of electrical engagement between contact members 106, 128.

Although a rotatable symmetrical switch assembly 100 is disclosed in the preferred embodiment, table 102 could be mounted for reciprocal movement in a straight line or curved path to provide relative movement between a finger contact 128 and the contact plate 106. In any event, the leading edge of contact 106 is tapered, such that when contact 128 is advanced in a transverse direction to path 104, different points along the tapered leading edge are engaged to provide a differential timing between the mating contact members.

I claim:

1. A stamped circuitry assembly including an integral metal stamping having a plurality of discrete conductive paths, a dielectric substrate having complementary recesses for receiving said conductive paths, the improvement comprising:

said substrate including an upstanding support wall, a movably mounted table with a surface defining at least one path of movement;

said stamping including a plurality of upstanding finger-like male contacts overlying and coextensive with said support wall so as to form a plug connector slidingly receivable in a plug-receiving cavity of a mating female receptacle connector having a plurality of mating second contacts;

said stamping further including a snap action switch having an elongated resilient spring plate with two parallel elongated spaced-apart slots therein forming two outside support arms each including a pair of spaced offset portions all extending in the same direction transverse to said spring plate and an intermediate flexing arm, a first mounting end and an opposed second free end, contact carrying means at said second free end, the switch further including actuator means deflecting a medial portion of the plate to displace the contact carrying means between first and second bistable positions, said actuator means comprising a rigid member having first and second engaging surfaces disposed on either side of said flexing arm, mounted for pivoting in a first direction to slide said first engaging surface along said flexing arm while deflecting said flexing arm from a first to a second bistable position;

a contact pad carried on the table and having a tapered leading edge, disposed along a portion of said path; and said stamping further including an elongated resilient finger-like contact means having a contact surface disposed on said path so as to electrically engage said contact pad as said table is moved, a moveable support arm extending in a direction transverse to said path, joined at a first end to said finger-like contact means and threadingly jointed at a second end to screw adjustment means operative to reciprocate said support arm in said transverse direction, whereby reciprocation of said support arm causes transverse displacement of said finger-like contact means, with said finger-like contact means engaging said contact pad at different points along its tapered leading edge, to thereby vary the length of the path along said contact pad travelled by said finger-like contact means.

* * * * *